(12) United States Patent
Horsley et al.

(10) Patent No.: US 6,674,383 B2
(45) Date of Patent: Jan. 6, 2004

(54) PWM-BASED MEASUREMENT INTERFACE FOR A MICRO-MACHINED ELECTROSTATIC ACTUATOR

(75) Inventors: David Horsley, Berkeley, CA (US);
Robert Conant, Berkeley, CA (US);
William Clark, Fremont, CA (US)

(73) Assignee: Onix Microsystems, Inc., Fremont, CA (US)

( * ) Notice: Subject to any disclaimer, the term of this patent is extended or adjusted under 35 U.S.C. 154(b) by 0 days.

(21) Appl. No.: 10/012,688

(22) Filed: Oct. 30, 2001

(65) Prior Publication Data

US 2002/0093446 A1 Jul. 18, 2002

Related U.S. Application Data

(60) Provisional application No. 60/245,249, filed on Nov. 1, 2000.

(51) Int. Cl.$^7$ .............................................. H03M 1/66
(52) U.S. Cl. ..................... 341/152; 341/148; 73/514.07
(58) Field of Search .................................. 341/148, 152

(56) References Cited

U.S. PATENT DOCUMENTS

| | | | | |
|---|---|---|---|---|
| 5,852,242 A | * | 12/1998 | Devolk et al. | ............ 73/514.57 |
| 5,867,302 A | | 2/1999 | Fleming | ...................... 359/291 |
| 6,137,941 A | * | 10/2000 | Robinson | ..................... 385/140 |
| 6,296,779 B1 | * | 10/2001 | Clark et al. | .................... 216/66 |
| 6,386,032 B1 | * | 5/2002 | Lemkin et al. | ........... 73/504.02 |

FOREIGN PATENT DOCUMENTS

EP     0683414     11/1995     ........... G02B/26/08

OTHER PUBLICATIONS

Fedder et al., *Multimode Digital Control of a Suspended Polysilicon Microstructure*, IEEE Journal of Microelectromechanical Systems, vol. 5, No. 4, Dec. 1996, pp. 283–297.*

Cheung et al., *Design, Fabrication, Position Sensing, and Control of an Electrostatically–driven Polysilicon Microactuator*, IEEE Transaction of Magnetics, vol. 32, No. 1 Jan. 1996, pp. 122128.*

(List continued on next page.)

*Primary Examiner*—Howard L. Williams
(74) *Attorney, Agent, or Firm*—JDI Patent; Joshua D. Isenberg

(57) ABSTRACT

Methods and apparatus for varying and measuring the position of a micromachined electrostatic actuator using a pulse width modulated (PWM) pulse train are disclosed. One or more voltage pulses are applied to the actuator. In each of the pulses, a voltage changes from a first state to a second state and remains in the second state for a time $t_{pulse}$ before returning to the first state. The position of the actuator may be varied by varying the time $\Delta t_{pulse}$. A position of the actuator may be determined by measuring a capacitance of the actuator when the voltage changes state, whether the time t is varied or not. An apparatus for varying the position of a MEMS device may include a pulse width modulation generator coupled to the MEMS device an integrator coupled to the MEMS device and an analog-to-digital converter coupled to the integrator. The integrator may measure a charge transferred during a transition of a pulse from the pulse generator. The integrator may include an amplifier, an integrator capacitor, a hold capacitor, a compensation voltage generator and three switches. The hold capacitor and integrator capacitor may be coupled to a MEMS device. The integrator capacitor, hold capacitor, and compensation voltage generator may be selectively coupled to the amplifier by two of the switches. The MEMS device and hold capacitor may be selectively coupled to ground by a third switch.

10 Claims, 2 Drawing Sheets

OTHER PUBLICATIONS

Yun et al., *Surface Micromachined, Digitally force–Balanced Accelerometer with Integrated CMOS Detection Circuitry*, Tech. Digest IEEE Solid–State Sensor and Actuator Workshop, Jun. 1992 pp. 126–131.*

S. Suzuki, K. Sato, S. Ueno, M. Sato, M. Esashi, "Semiconductor Capacitance–Type Accelerometer with PWM Electrostatic Servo Technique," Sensors and Actuators, A21–A23 (1990) pp. 316–319.

B. E. Boser, "Electronics for Micromachined Inertial Sensors", Transducers '97, 1997 International Conference on Solid–State Sensors and Actuators, Chicago, Jun. 16–19, 1997.

E. K. Chan, K. Garikipati, R. W. Dutton, "Characterization of Contact Electromechanics Through Capacitance—Voltage Measurements and Simulations," Journal of Microelectromechanical Systems, vol. 8, No. 2, Jun. 1999.

C. T. Nguyen, "Micromechanical Signal Processors," Doctoral Dissertation, UC Berkeley, Dec., 1994.

L. Y. Lin, E. L. Goldstein, R. W. Tkach, Free–Space Micromachined Optical Switches with Submillisecond Switching Time for Large Scale Optical Cross–Connects, IEEE Ptotonics Technology Letters, vol. 10, No. 4, Apr. 1998.

H. Toshioshi, H. Fujita, "Electrostatic Micro Torsion Mirrors for an Optical Switch Matrix," Journal of Microelectromechanical Systems, vol. 5, No. 4, Dec. 1996.

A. Selvakumar, K. Najafi, "A High Sensitivity Z–Axis Capacitive Silicon Microacceleraometer with a Torsional Suspension," Journal of Microelectromechanical Systems, vol. 7, No. 2, Jun. 1998.

P. Cheung, R. Horowitz, R. T. Howe, "Design, Fabrication, Position Sensing, and Control of an Electrostatically–driven Polysilicon Microactuator," IEEE Transactions on Magnetics, vol. 32, No. 1, Jan. 1996.

M. Oda, M. Shirashi, "Mechanically Operated Optical Matrix Switch," Fujitsu Scientific and Technical Journal, Sep., 1981.

E. K. Chan, R. W. Dutton, "Electrostatic Micromechanical Actuator with Extended Range of Travel," Journal of Microelectromechanical Systems, vol.: 9 Issue: 3, Sep. 1000 pp. 321–328.

* cited by examiner

PWM-BASED MEASUREMENT INTERFACE FOR A MICRO-MACHINED ELECTROSTATIC ACTUATOR

CROSS-REFERENCE TO A RELATED APPLICATION

This application is based on and claims priority from Provisional application No. 60/245,249 filed Nov. 1, 2000, the entire disclosure of which is incorporated herein by reference.

FIELD OF THE INVENTION

This invention relates generally to microelectromechanical system (MEMS) devices. More particularly, it relates to actuating and measuring the motion of a micro-machined electrostatic actuator.

BACKGROUND OF THE INVENTION

Prior methods for capacitive position sensing of MEMS devices have been focused towards inertial sensors such as accelerometers and gyroscopes. These earlier techniques were subject to the following disadvantages:

1. Sensitivity to low-frequency amplifier noise, such as voltage offset and 1/f noise.
2. Sensitivity to capacitive "feed-through" of the drive signal into the measurement signal. Many prior art MEMS drive systems apply a small AC signal on top of a DC drive voltage. The AC signal is used to measure the capacitance of the MEMS device. Variations of the DC signal can be picked up by the capacitance sensing circuitry. Such pick-up is known as feed-through and is a form of noise. This noise may be significant since prior art capacitive sensing systems provide only a small amount of current for capacitive sensing.
3. Non-linear actuation force.
4. Analog interface. An analog interface adds to the complexity of the control circuitry.

SUMMARY OF THE INVENTION

The disadvantages associated with the prior art are overcome by embodiments of the present invention directed to methods and apparatus for varying and measuring the position of a micromachined electrostatic actuator using a pulse width modulated (PWM) pulse train. According to a method for varying the position of the actuator, one or more voltage pulses are applied to the actuator. In each of the pulses, a voltage changes from a first state to a second state and remains in the second state for a time $\Delta t_{pulse}$ before returning to the first state. The position of the actuator may be varied by varying the time $\Delta t_{pulse}$. A position of the actuator may be determined by measuring a capacitance of the actuator when the voltage changes state, whether the time t is varied or not.

An apparatus for varying the position of a MEMS device may include a pulse width modulation generator coupled to the MEMS device an integrator coupled to the MEMS device and an analog-to-digital converter coupled to the integrator. The integrator may measure a charge transferred during a transition of a pulse from the pulse generator. The integrator may comprise an amplifier, an integrator capacitor, a hold capacitor, a compensation voltage generator and three switches. The hold capacitor and integrator capacitor may be coupled to a MEMS device. The integrator capacitor, hold capacitor, and compensation voltage generator may be selectively coupled to the amplifier by two of the switches. The MEMS device and hold capacitor may be selectively coupled to ground by a third switch.

Embodiments of the present invention that use a switching integration technique are relatively insensitive to noise sources that have been problematic in the prior art.

Embodiments of the present invention use time-multiplexing to separate the measurement period from the driving period, eliminating cross-talk between the drive and measurement signals.

Because embodiments of the present invention use a constant amplitude PWM pulse train, they are not subject to the quadratic voltage to force non-linearity found in typical electrostatic actuation techniques.

Embodiments of the present invention use an entirely digital interface, rendering them compatible with modern digital feedback control systems.

DETAILED DESCRIPTION

It will be clear to one skilled in the art that the above embodiment may be altered in many ways without departing from the scope of the invention.

Figure 1:
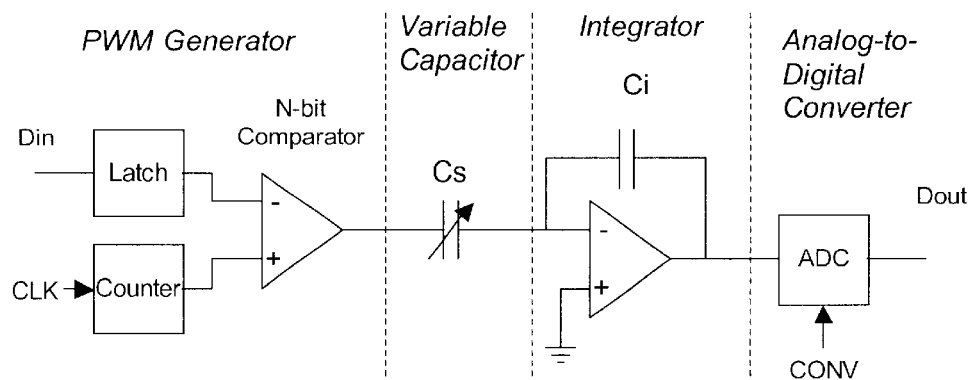
FIG. 1 is a schematic diagram of a circuit according to an embodiment of the present invention.

A circuit diagram according to an embodiment of the invention is illustrated in FIG. 1. The circuit consists of four stages—a pulse width modulation generator PWM, a MEMS device, represented as a variable sensor capacitor Cs, an integrator, and an analog-to-digital converter ADC. In the circuit, an input digital word Din is first converted into a PWM pulse train by the PWM generator. The voltage pulse train includes one or more pulses characterized by a pulse width $\Delta t_{pulse}$. The voltage pulse train is applied to a MEMS device, represented in FIG. 1 as a variable sensor capacitor, Cs, and the resulting current is integrated across an integrator having a capacitance Ci. The amplitude of the pulse train output from the integrator is simply the amplitude of the input pulse train scaled by the ratio of the sensor capacitance to the integrator capacitance, Cs/Ci. After a short time-delay $\Delta t_s$ to allow the integrator to settle, the amplitude of each output pulse is sampled and converted into a digital signal using a sampling analog-to-digital converter ADC. To allow the integrator enough time to settle, the pulse width $\Delta t_{pulse}$ is preferably greater than or equal to the sum of the integrator time-delay $\Delta t_s$ and the ADC conversion time, $\Delta t_{ADC}$.

Figure 2:
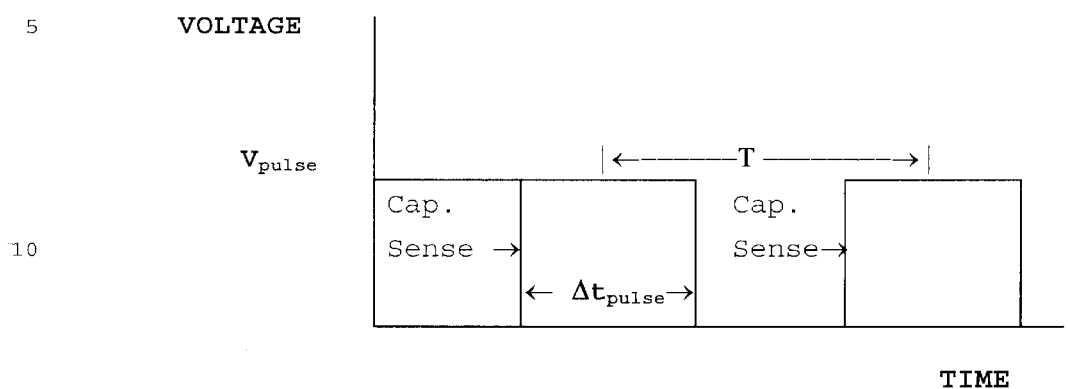
FIG. 2 is a timing diagram illustrating pulsed actuation and measurement according to an embodiment of the present invention.

FIG. 2 depicts a graph of voltage versus time that illustrates capacitive sensing and pulse width modulation. The time-averaged drive voltage applied to the MEMS device may be changed by varying the pulse width $\Delta t_{pulse}$. If the pulse period T is shorter than the response time for the MEMS device, the device responds to the time averaged drive voltage. Thus, the position of the MEMS device may be varied by varying $\Delta t_{pulse}$, i.e., by varying the duty cycle of the pulse train. Preferably, the integrator measures charge transferred during a transition of the pulse, either from high to low or low to high. Therefore, a variation in $\Delta t_{pulse}$ will not affect the capacitance measurement. Since the MEMS drive operates by pulse width modulation, a constant pulse height Vp may be used, simplifying the capacitance measurement. Furthermore, since the drive voltage VP is used as the sense voltage, a large sense signal is available, which greatly enhances the signal to noise ratio of the capacitance measurement.

Figure 3:
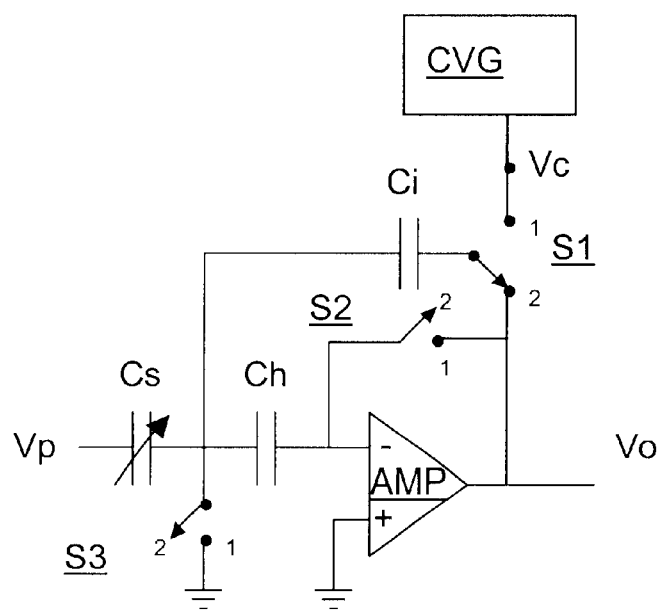
FIG. 3 is a schematic diagram of a switched capacitor integrator implementation according to an embodiment of the present invention.

A switched-capacitor implementation of the integrator portion of the circuit is illustrated in FIG. 3. The circuit generally comprises an amplifier AMP, an integrator capacitor Ci, a hold capacitor Ch, a compensation voltage generator CVG and three switches S1, S2, S3. The hold capacitor Ch and integrator capacitor Ci are coupled to a MEMS device, represented by a variable capacitance Cs. The integrator capacitor Ci, hold capacitor Ch, and compensation voltage generator CVG are selectively coupled to the amplifier by two of the switches S1, S2. The MEMS device and hold capacitor Ch may be selectively coupled to ground by the third switch S3.

The advantage of this approach is that it is insensitive to low-frequency noise, such as amplifier offset and 1/f noise. A simple explanation of the circuit function is as follows. During the reset phase, all three switches are switched to position 1. The amplifier becomes a voltage follower, and charges the hold capacitor, Ch, with the amplifier offset voltage. The compensation voltage generator CVG charges the integrator capacitor, Ci, with a compensation voltage Vc. During the integration phase, the switches S1, S2, S3 are all switched into position 2, in anticipation of the PWM pulse. The output voltage, Vo, is initially equal to the compensation voltage, Vc. Finally, the PWM pulse is applied to the sense capacitor, causing charge to flow through the sense capacitor. A compensating charge flows through the integrator capacitor, and the output voltage becomes (Vc—(Cs/Ci)Vp), where Vp is the amplitude of the input PWM pulse.

The principle by which the MEMS device represented by the variable capacitance Cs is actuated may be described as follows. A PWM signal is generated by modulating the duty cycle of a fast pulse train with a slower base-band signal. In FIG. 1, the digital input Din provides the base-band signal, while the fast pulse train is generated at a rate equal to a counter's clock frequency divided by the maximum count, $f_{CLK}/2^N$.

The digital input word, Din, is first converted into a PWM signal that is input to the micro-machined actuator represented by the variable capacitor, Cs. The resulting current is integrated, and the result is sampled and converted into a digital word, Dout, by the analog to digital converter.

The position of the micro-machined actuator is only capable of responding to the components of the PWM signal that are within its mechanical bandwidth. Provided that the fundamental PWM frequency is well above this bandwidth, the actuator behaves like a demodulator, recovering only the base-band signal.

For measurement purposes, because the pulse rate is much faster than the maximum base-band component, the sensor capacitance may be considered to be approximately constant for the duration of each pulse. In addition, to allow sufficient time for each measurement, the PWM pulse must be guaranteed high at the beginning of each pulse period and guaranteed low at the end of each period. Some of the dynamic range of the PWM input is lost as a consequence of this requirement, but it also effectively separates the measurement phase from the actuation phase, ensuring that the measurement signal of a particular sensor is not corrupted by cross-talk from adjacent devices. For example, in an array of devices, if the capacitances of the devices are measured on the rise of the pulses and since all of the drive pulses rise at the same time, any cross talk between different MEMS devices will be constant and, therefore, can be calibrated. Any cross-talk resulting from pulses falling at different times may be rendered irrelevant by simply not measuring capacitance when the pulses fall.

Because each PWM pulse has a constant amplitude, the amplitude of the voltage output from the integrator is directly proportional to this amplitude scaled by the ratio of the sensor capacitance to the integrator capacitance. For reduced sensitivity to temperature variations, this integrator capacitor may be a micro-machined capacitor whose temperature coefficient is matched to that of the sensor capacitor. Additionally, for reduced sensitivity to variations in the PWM pulse amplitude, the PWM voltage source may be used to generate a reference voltage for the ADC.

The various embodiments of the present invention may be applied to systems having multiple MEMS devices such as arrays of optical switching mirrors.

What is claimed is:

1. A method of varying the position of a micromachined electrostatic actuator using a pulse width modulated (PWM) pulse train, comprising:

applying one or more voltage pulses to the actuator wherein a voltage changes from a first state to a second state and remains in the second state for a time $\Delta t_{pulse}$ before returning to the first state; and varying the position of the actuator by varying the time $\Delta t_{pulse}$.

2. The method of claim 1, further comprising, determining a position of the actuator by measuring a capacitance of the actuator when the voltage changes state.

3. The method of claim 2, wherein the capacitance is measured by integrating a current to the actuator with an integrator and converting the integrated current to a digital word with an analog-to-digital converter (ADC).

4. The method of claim 3, wherein the integrator measures charge transferred during a transition of one or more of the voltage pulses.

5. The method of claim 3, wherein the time $\Delta t_{pulse}$ is greater than or equal to the sum of time-delay of the integrator $\Delta t_s$ and an conversion time of the ADC $\Delta t_{ADC}$.

6. The method of claim 1, wherein a frequency of the PWM signal is above a mechanical bandwidth of the actuator.

7. The method of claim 1, wherein the time $\Delta t_{pulse}$ is varied by modulating the duty cycle of a fast pulse train with a slower base-band signal.

8. An apparatus for varying the position of a MEMS device, comprising:

a pulse width modulation generator coupled to the MEMS device an integrator coupled to the MEMS device and an analog-to-digital converter coupled to the integrator.

9. The apparatus of claim 8, wherein the integrator measures charge transferred during a transition of a pulse from the pulse width modulation generator.

10. The apparatus of claim 8, wherein the integrator includes an amplifier, having at least one input and an output, an integrator capacitor coupled to the MEMS device, a hold capacitor, a compensation voltage generator, and first, second and third switches, wherein the hold capacitor is coupled to the MEMS device, wherein the hold capacitor is coupled to the input of the amplifier wherein the first switch selectively couples the hold capacitor to the compensation voltage generator or the output of the amplifier, wherein the second switch selectively couples input of the amplifier to the output of the amplifier, wherein the third switch selectively couples MEMS device and the hold capacitor to ground.

* * * * *